(12) United States Patent
Watanabe

(10) Patent No.: US 12,525,515 B2
(45) Date of Patent: Jan. 13, 2026

(54) GROOVE PORTION SURROUNDING THE MOUNTING REGION OF A LEAD FRAME

(71) Applicants: Kabushiki Kaisha Toshiba, Tokyo (JP); Toshiba Electronic Devices & Storage Corporation, Tokyo (JP)

(72) Inventor: Kazuhiro Watanabe, Ibo Hyogo (JP)

(73) Assignees: Kabushiki Kaisha Toshiba, Kawasaki (JP); Toshiba Electronic Devices & Storage Corporation, Kawasaki (JP)

(*) Notice: Subject to any disclaimer, the term of this patent is extended or adjusted under 35 U.S.C. 154(b) by 306 days.

(21) Appl. No.: 18/174,610

(22) Filed: Feb. 25, 2023

(65) Prior Publication Data

US 2024/0087994 A1 Mar. 14, 2024

(30) Foreign Application Priority Data

Sep. 13, 2022 (JP) ................. 2022-145352

(51) Int. Cl.
| | |
|---|---|
| H01L 23/495 | (2006.01) |
| H01L 21/56 | (2006.01) |
| H01L 23/13 | (2006.01) |
| H01L 23/31 | (2006.01) |
| H01L 23/49 | (2006.01) |
| H01L 23/492 | (2006.01) |

(52) U.S. Cl.
CPC ........ *H01L 23/49548* (2013.01); *H01L 21/56* (2013.01); *H01L 23/13* (2013.01); *H01L 23/3142* (2013.01); *H01L 23/49* (2013.01); *H01L 23/492* (2013.01); *H01L 23/49513* (2013.01); *H01L 23/49575* (2013.01); *H01L 2924/181* (2013.01)

(58) Field of Classification Search
CPC . H01L 23/49548; H01L 23/13; H01L 23/492; H01L 23/49575; H01L 23/3107; H01L 2924/181; H01L 21/56; H01L 23/49541; H01L 23/3142; H01L 23/49513
See application file for complete search history.

(56) References Cited

U.S. PATENT DOCUMENTS

| | | |
|---|---|---|
| 5,278,446 A | 1/1994 | Nagaraj et al. |
| 6,713,849 B2 | 3/2004 | Hasebe |

(Continued)

FOREIGN PATENT DOCUMENTS

| | | |
|---|---|---|
| JP | S5624151 U | 3/1981 |
| JP | S5712747 U | 1/1982 |

(Continued)

OTHER PUBLICATIONS

Notice of Reasons for Refusal (Office Action) mailed Oct. 17, 2025 in corresponding Japanese Patent Application No. 2022-145352 with English machine translation, 6 pages.

*Primary Examiner* — Alonzo Chambliss
(74) *Attorney, Agent, or Firm* — Kim & Stewart LLP

(57) ABSTRACT

A lead frame according to the present embodiments includes: a main body portion having a main surface including a mounting region on which a semiconductor chip is to be mounted; a lead portion connected to the main body portion; a groove portion provided in a main surface of the main body portion so as to surround the mounting region, the groove portion having an inner side surface and an outer side surface; and a protruding portion protrudingly provided along an inner edge of the groove portion.

14 Claims, 16 Drawing Sheets

(56) References Cited

U.S. PATENT DOCUMENTS

| | | | |
|---|---|---|---|
| 7,301,225 B2 * | 11/2007 | Wong | H01L 24/48 |
| | | | 438/11 |
| 10,297,516 B2 | 5/2019 | Nagamatsu et al. | |
| 11,756,866 B2 * | 9/2023 | Kaneko | H01L 23/49503 |
| | | | 257/676 |
| 2017/0110390 A1 | 4/2017 | Hinrich et al. | |

FOREIGN PATENT DOCUMENTS

| | | |
|---|---|---|
| JP | S62-200751 A | 9/1987 |
| JP | H02-018952 A | 1/1990 |
| JP | H03-125466 A | 5/1991 |
| JP | H03266459 A | 11/1991 |
| JP | H0677353 A | 3/1994 |
| JP | H07161891 A | 6/1995 |
| JP | H08195468 A | 7/1996 |
| JP | H10-303355 A | 11/1998 |
| JP | 2006303216 A | 11/2006 |
| JP | 4609172 B2 | 1/2011 |
| JP | 5183583 B2 | 4/2013 |
| JP | 2015216152 A | 12/2015 |
| JP | 2017-079229 A | 4/2017 |
| JP | 2017510991 A | 4/2017 |
| JP | 6468085 B2 | 2/2019 |
| JP | 2019114618 A | 7/2019 |
| WO | 2017169485 A1 | 10/2017 |

* cited by examiner

GROOVE PORTION SURROUNDING THE MOUNTING REGION OF A LEAD FRAME

CROSS-REFERENCE TO RELATED APPLICATIONS

This application is based upon and claims the benefit of priority from the prior Japanese Patent Application No. 2022-145352, filed on Sep. 13, 2022; the entire contents of which are incorporated herein by reference.

FIELD

Embodiments described herein relate generally to a lead frame and a semiconductor device.

BACKGROUND

As a semiconductor device manufactured using a lead frame, there is a metal oxide semiconductor field effect transistor (MOSFET) and the like. The semiconductor device has a structure in which a semiconductor chip disposed on a metal plate via a mount material is covered with a mold resin or the like. When the mold resin absorbs moisture, the moisture condenses between a sealing portion and the metal plate. When the semiconductor device is heated to a high temperature in such a state, the sealing portion and the metal plate may be peeled apart due to a vapor pressure of the moisture. In order to avoid such a situation, a method is known in which a groove portion is provided in the metal plate to suppress peel-off between the mold resin and the metal plate.

However, in manufacturing a semiconductor device, when a semiconductor chip is mounted on a metal plate via a mount material, the mount material sometimes flows out of a mounting region. As a result, for example, the mount material flows into the groove portion, and peel-off between the sealing portion and the metal plate easily occurs.

BRIEF DESCRIPTION OF THE DRAWINGS (a) of FIG. 1A is a plan view of a lead frame according to an embodiment; (b) of FIG. 1A is a side view of a lead frame according to an embodiment;

DETAILED DESCRIPTION

Figure 1A:
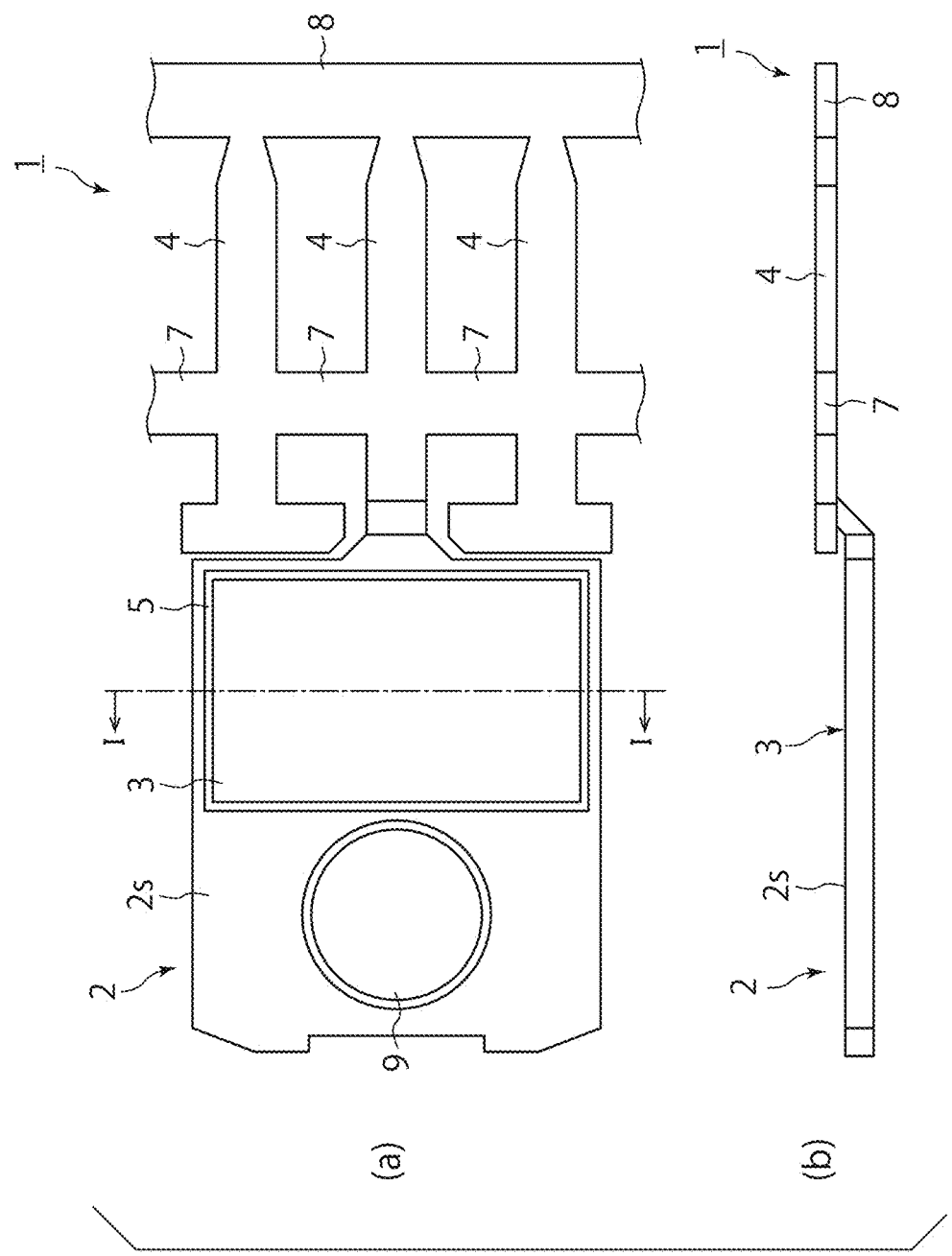
FIG. 1B is a sectional view of a lead frame according to a first embodiment taken along line I-I in (a) of FIG. 1A.

A lead frame according to an embodiment includes: a main body portion having a main surface including a mounting region on which a semiconductor chip is to be mounted; a lead portion connected to the main body portion; a groove portion provided in a main surface of the main body portion so as to surround the mounting region, the groove portion having an inner side surface and an outer side surface; and a protruding portion protrudingly provided along an inner edge of the groove portion.

Hereinafter, embodiments of the present invention will be described with reference to the drawings. The drawings are schematic or conceptual, and ratios of portions and the like are not necessarily the same as actual ones. In the specification and the drawings, the same elements as those already described with respect to previously described drawings are denoted by the same reference numerals, and the detailed description thereof is appropriately omitted.

Note that terms and dimensions such as "orthogonal", "parallel", and "intersect at an acute angle", values of physical characteristics, and the like, which specify shapes, geometric conditions, physical characteristics, and degrees thereof used in the present specification, are not limited to strict meanings and are interpreted including such a range that similar functions can be expected.

First Embodiment

Figure 1B:
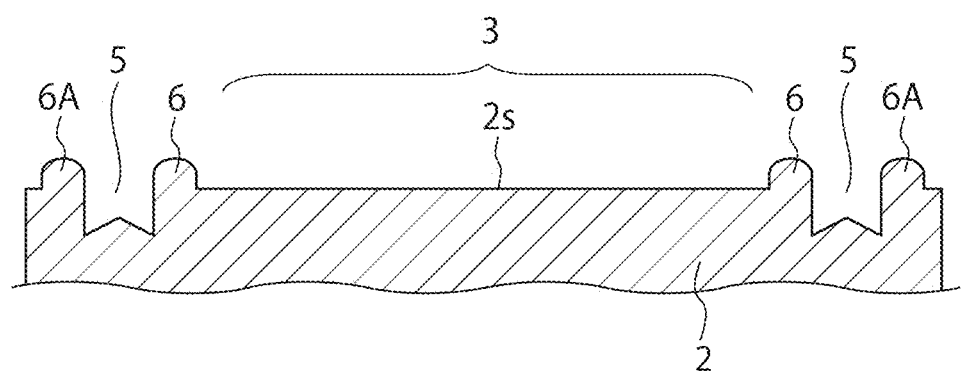

With reference to FIGS. 1A and 1B, a lead frame 1 according to a first embodiment will be described. (a) of FIG. 1A is a plan view of the lead frame 1 according to the present embodiment, and (b) of FIG. 1A is a side view of the lead frame 1 according to the present embodiment. FIG. 1B is a sectional view of the lead frame 1 according to the present embodiment taken along line I-I in (a) of FIG. 1A.

As shown in FIGS. 1A and 1B, the lead frame 1 includes a main body portion (mounting portion) 2, a plurality of lead portions 4, a groove portion 5, a protruding portion (protrusion) 6, a protruding portion 6A, tie bars 7, a frame 8, and a through-hole 9. The lead frame 1 is obtained by, for example, punching a metal plate. The material of the lead frame 1 is not particularly limited, and is, for example, copper, 42% Ni—Fe alloy (42 alloy), or the like.

The main body portion 2 has a main surface 2s including a mounting region 3. The mounting region 3 is also called a bed portion, and is a region on which a semiconductor chip 60 described later is to be mounted.

In the present embodiment, the three lead portions 4 are provided. One of the lead portions 4 is directly connected to the main body portion 2, and the other two lead portions 4 are connected to the main body portion 2 via the tie bars 7 and the frame 8. The tie bars 7 and the frame 8 are removed in a process of manufacturing a semiconductor device 40 (to be described later) by using the lead frame 1. The number, shape, and the like of the lead portions 4 are arbitrary.

The groove portion 5 is provided in the main surface 2s of the main body portion 2 so as to surround the mounting region 3. The groove portion 5 may be provided so as to continuously surround the mounting region 3 as illustrated in FIG. 1A, or may be provided so as to intermittently surround the mounting region 3.

The protruding portion 6 is protrudingly provided on the main surface 2s of the main body portion 2 and is protrudingly provided along the inner edge of the groove portion 5 (that is, along one of the both edges of the groove portion 5 on the mounting region 3 side). That is, the protruding portion 6 is protrudingly provided so as to surround the mounting region 3. As will be described in detail later, this can suppress the mount material 80 from flowing out of the mounting region 3 when the semiconductor chip 60 is mounted. Preferably, the protruding portion 6 is protrudingly provided so as to surround the mounting region 3 seamlessly. The protruding portion 6 may have a gap at a part as long as the above effect is provided.

Figure 5:
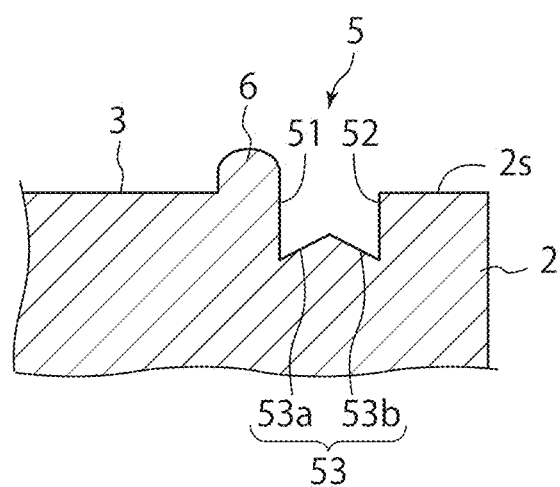
FIG. 5 is a longitudinal sectional view of a groove portion of a lead frame according to a third variation of the first embodiment.

The protruding portion 6A is protrudingly provided on the main surface 2s of the main body portion 2 and is protrudingly provided along the outer edge of the groove portion 5 (that is, along one of the both edges of the groove portion 5 on the opposite side with respect to the mounting region 3). The protruding portion 6A may be protrudingly provided so as to surround the mounting region 3 seamlessly, or gaps may be provided in a broken line shape. As illustrated in FIG. 5 to be described later, the protruding portion 6A does not need to be protrudingly provided.

The through-hole 9 is provided in the main body portion 2 of the lead frame 1. The through-hole 9 is a hole through which a bolt or the like is inserted to fix the semiconductor device 40 to a heat sink or the like. The through-hole 9 does not need to be provided.

Figure 2:
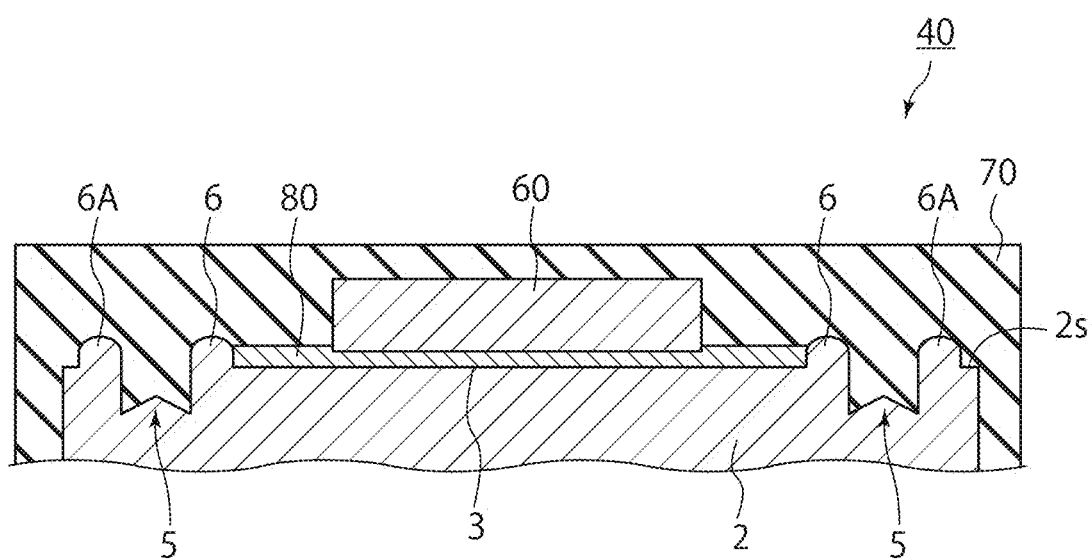
FIG. 2 is a sectional view, corresponding to FIG. 1B, of a semiconductor device according to the first embodiment.

Next, a semiconductor device 40 manufactured using the lead frame 1 will be described with reference to FIG. 2. FIG. 2 is a sectional view, corresponding to FIG. 1B, of the semiconductor device 40 according to the present embodiment. The semiconductor device 40 is, for example, a MOSFET or the like.

As illustrated in FIG. 2, the semiconductor device 40 includes a main body portion (mounting portion) 2, a groove portion 5, protruding portions 6 and 6A, a semiconductor chip 60, a sealing portion 70, and a mount material 80. Although not illustrated, the semiconductor device 40 further includes a plurality of lead portions 4 and a through-hole 9. Of these, the main body portion 2, the lead portions 4, the groove portion 5, the protruding portions 6 and 6A, and the through-hole 9 are the same as those of the lead frame 1, and description thereof is therefore omitted.

As illustrated in FIG. 2, the semiconductor chip 60 is mounted on the mounting region 3 of the main body portion 2 via the mount material 80. More specifically, the semiconductor chip 60 is mounted, via the mount material 80, on the mounting region 3 of the main body portion 2 surrounded by the groove portion 5 and the protruding portions 6 and 6A. Note that the semiconductor chip 60 may be electrically connected to the lead portions 4 via cables (nots illustrated). In addition, the semiconductor chip 60 may be electrically connected to the main body portion 2 via the mount material 80.

Note that the position of the semiconductor chip 60 is arbitrary as long as it is on the mounting region 3. A plurality of semiconductor chips may be mounted on the mounting region 3.

The sealing portion 70 is provided so as to embed therein the protruding portions 6 and 6A, the semiconductor chip 60, and the mount material 80. The groove portion 5 is filled with the sealing portion 70. The material of the sealing portion 70 is, for example, epoxy resin.

Examples of the material of the mount material 80 include a mount paste, solder, and a silver sintering material. As shown in FIG. 2, the height of the protruding portion 6 may be higher than the height of the upper surface of the mount material 80. As a result, it is possible to further suppress the mount material 80 from flowing out of the mounting region 3 when the semiconductor chip 60 is mounted on the mounting region 3 via the mount material 80. In addition, it is also advantageous that the height of the protruding portion 6 is higher than the height of the upper surface of the mount material 80, for example, when the semiconductor chip 60 is mounted near the protruding portion 6 or when a plurality of semiconductor chips are mounted on the mounting region 3.

Figure 3A:
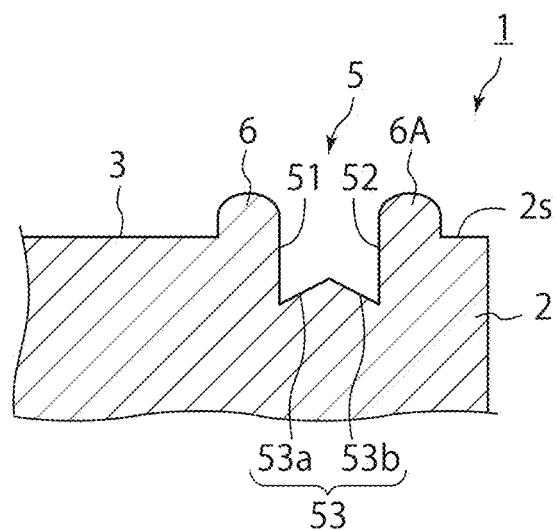
FIG. 3A is a longitudinal sectional view of a groove portion of the lead frame according to the first embodiment.
Figure 3B:
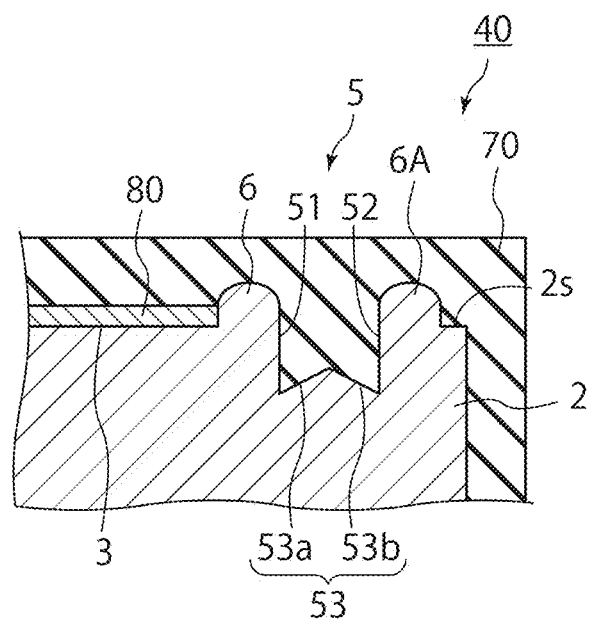
FIG. 3B is a longitudinal sectional view of the groove portion of the semiconductor device according to the first embodiment.

Next, with reference to FIGS. 3A and 3B, a sectional shape of the groove portion 5 according to the present embodiment will be described in detail. FIG. 3A is a longitudinal sectional view of the groove portion 5 of the lead frame 1 according to the present embodiment. FIG. 3B is a longitudinal sectional view of the groove portion 5 of the semiconductor device 40 according to the present embodiment.

As illustrated in FIGS. 3A and 3B, the groove portion 5 has an inner side surface 51, an outer side surface 52, and a bottom surface 53. The inner side surface 51 is provided so as to be orthogonal to the main surface 2s. The outer side surface 52 is provided so as to be orthogonal to the main surface 2s and to face the inner side surface 51. That is, the inner side surface 51 and the outer side surface 52 are provided so as to face each other. The bottom surface 53 is provided so as to connect the inner side surface 51 and the outer side surface 52. As illustrated in FIGS. 3A and 3B, the bottom surface 53 has an inverted V-shape in which a central part is high. More specifically, the bottom surface 53 includes at least a partial surface 53a and a partial surface 53b. Here, the partial surface 53a is connected to the inner side surface 51 and intersects the inner side surface 51 at an acute angle. The partial surface 53b is connected to the outer side surface 52 and intersects the outer side surface 52 at an acute angle.

Note that, in the present specification, the expression "two surfaces face each other" means that the two surfaces are substantially parallel. That is, in the present embodiment, the inner side surface 51 and the outer side surface 52 are provided substantially in parallel.

As described above, according to the lead frame 1 and the semiconductor device 40 according to the present embodiment, the protruding portion 6 is protrudingly provided so as to surround the mounting region 3. As a result, it is possible to suppress the mount material 80 from flowing out of the mounting region 3 of the main body portion 2 when the semiconductor chip 60 is mounted on the main body portion 2 of the lead frame 1. For example, it is possible to suppress a decrease in a junction area between the groove portion 5 and the sealing portion 70 caused by the mount material 80 flowing into the groove portion 5. In addition, as compared with a case where the protruding portion 6 is not protrudingly provided, the junction area between the main body portion 2 and the sealing portion 70 is increased, and it is possible to further suppress the sealing portion 70 from peeling off the main body portion 2. In the present embodiment, the protruding portion 6 has a semicircular sectional shape without being limited thereto, and may have a sectional shape such as a rectangular shape or an inverted V-shape (mountain shape).

In the lead frame 1 and the semiconductor device 40 according to the present embodiment, as for the shape of the groove portion 5, as described above, the inner side surface 51 is orthogonal to the main surface 2s, the outer side surface 52 is orthogonal to the main surface 2s and faces the inner side surface 51, and the bottom surface 53 connects the inner side surface 51 and the outer side surface 52. Further, the bottom surface 53 has a shape including the partial surface 53a intersecting the inner side surface 51 at an acute angle and including the partial surface 53b intersecting the outer side surface 52 at an acute angle. That is, the groove portion 5 has a plurality of combinations of surfaces intersecting at an acute angle. Therefore, in the semiconductor device 40 according to the present embodiment, the sealing portion 70 filling the groove portion 5 has a shape complementary to the shape of the groove portion 5. That is, the sealing portion 70 has a plurality of combinations of surfaces intersecting at an acute angle in the part of the sealing portion 70 that fills the groove portion 5. Therefore, according to the present embodiment, it is possible to further suppress peel-off of the sealing portion 70 from the main body portion 2.

The depth of the groove portion 5 is arbitrary, but is preferably deeper. By making the groove portion 5 deep, a junction area between the sealing portion 70 and the groove portion 5 is increased. Accordingly, it is possible to further suppress peel-of the sealing portion 70 from the main body portion 2. The same applies to the following embodiments.

Figure 4A:
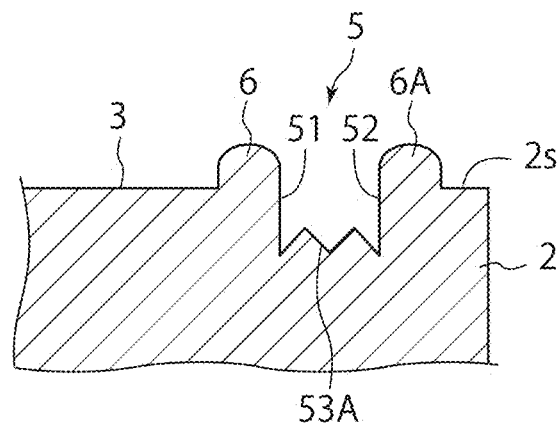
FIG. 4A is a longitudinal sectional view of a groove portion of a lead frame according to a first variation of the first embodiment.
Figure 4B:
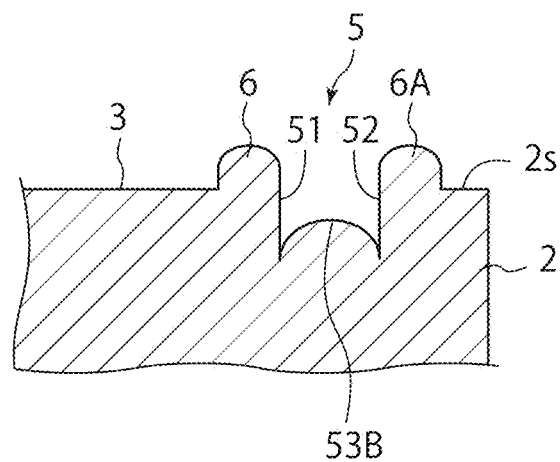
FIG. 4B is a longitudinal sectional view of a groove portion of a lead frame according to a second variation of the first embodiment.

Note that the shape of the bottom surface 53 is not limited to the above, and may be, for example, shapes as illustrated in FIGS. 4A and 4B. In FIG. 4A, the bottom surface 53A has a so-called inverted W-shape. Further, in FIG. 4B, the bottom surface 53B has an arc shape, so to speak, an inverted U-shape. Both the bottom surface 53A and the bottom surface 53B respectively intersect the inner side surface 51 and the outer side surface 52 at an acute angle. Therefore, the same effects as those of the above present embodiment can be obtained.

According to the lead frame 1 and the semiconductor device 40 according to the present embodiment, the protruding portion 6A is protrudingly provided along the outer edge of the groove portion 5. As a result, as compared with a case where the protruding portion 6A is not protrudingly provided, the junction area between the main body portion 2 and the sealing portion 70 is increased, and it is possible to further suppress the sealing portion 70 from peeling off the main body portion 2. As shown in FIG. 5, the protruding portion 6A does not need to be protrudingly provided on the outer edge of the groove portion 5. In the present embodiment, the protruding portion 6A has a semicircular sectional shape without being limited thereto, and may have a sectional shape such as a rectangular shape or an inverted V-shape (mountain shape).

(Method of Manufacturing Lead Frame According to First Embodiment)

Figure 6:
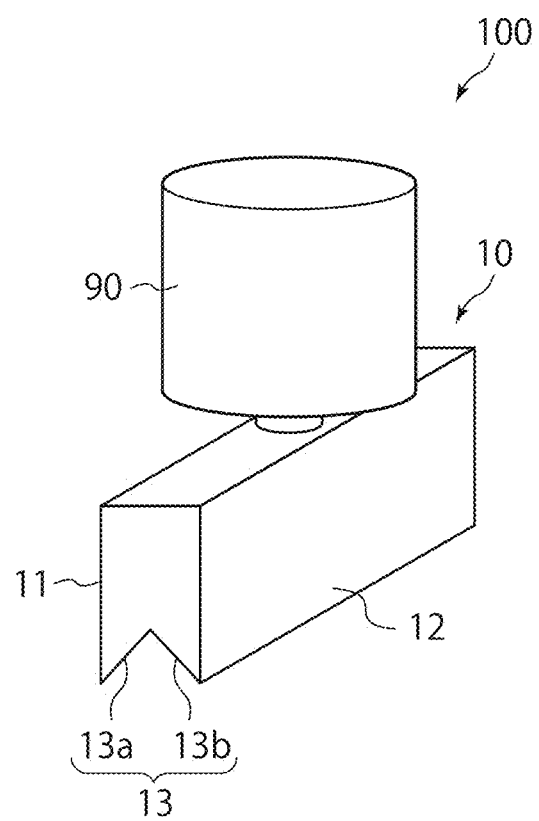
FIG. 6 is a perspective view of a jig for forming the groove portion according to the first embodiment.
Figure 7:
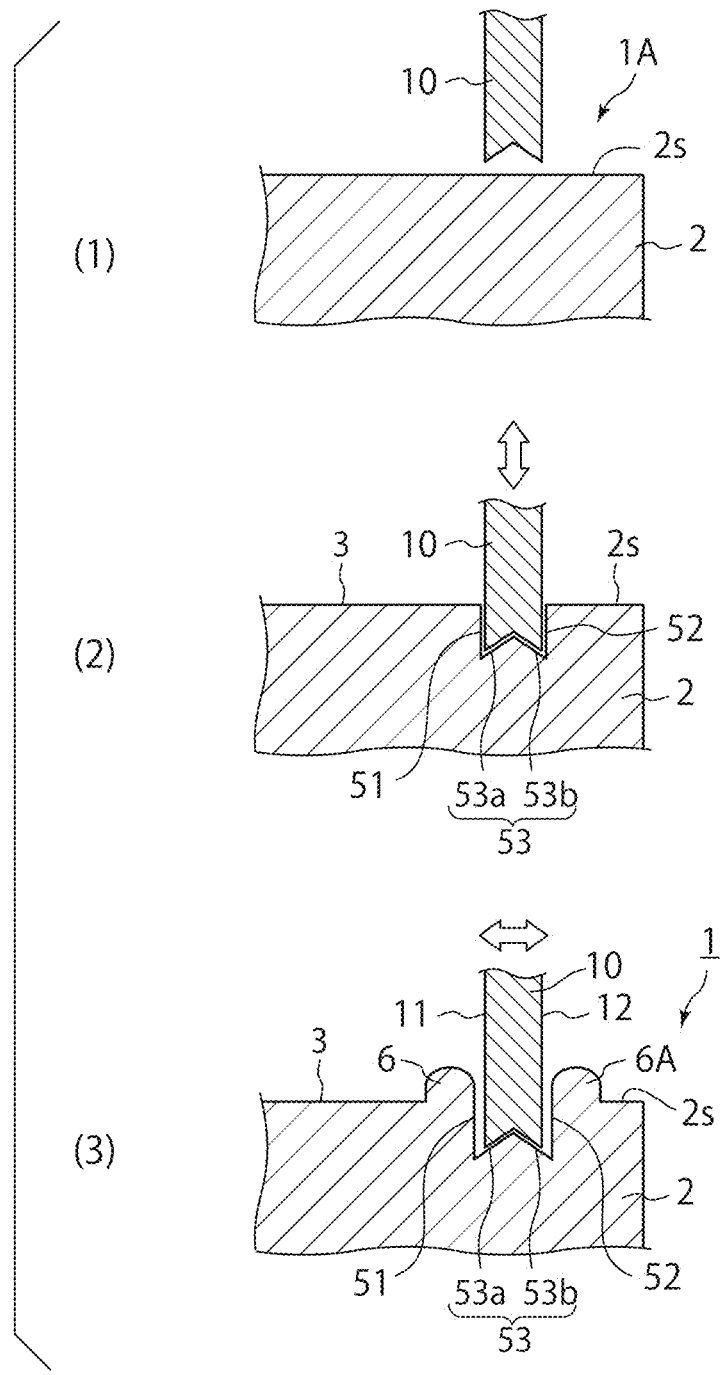
FIG. 7 is a view for illustrating steps of forming the groove portion according to the first embodiment.

Next, with reference to FIGS. 6 and 7 an example of a method of manufacturing the lead frame 1 according to the first embodiment will be described. FIG. 6 is a perspective view of a jig 100 used to form the groove portion 5 according to the present embodiment. FIG. 7 is a longitudinal sectional view illustrating steps of forming the groove portion 5 according to the present embodiment.

First, as illustrated in FIG. 6, the jig 100 for forming the groove portion 5 is prepared. The jig 100 includes a blade 10 and an ultrasonic device 90 connected to the blade 10.

The blade 10 has a shape complementary to the groove portion 5. That is, the blade 10 includes a side surface 11, a side surface 12, and a top end face 13. Here, the side surface 11 and the side surface 12 are parallel to each other. The top end face 13 includes a partial surface 13a that intersects the side surface 11 at an acute angle and a partial surface 13b that intersects the side surface 12 at an acute angle. The material of the blade 10 is arbitrary as long as the material has hardness necessary to form the groove portion 5, and is, for example, cemented carbide.

The ultrasonic device 90 is an ultrasonic generator that applies ultrasonic vibration to the blade 10 in the longitudinal direction and the lateral direction. The frequency of the ultrasonic vibration is, for example, 20 kHz to 100 kHz.

Next, as shown in (1) of FIG. 7, a lead frame member 1A is prepared. The lead frame member 1A is a lead frame 1 in which the groove portion 5 and the protruding portions 6 and 6A are not formed. Then, the blade 10 of the jig 100 is brought into vertical contact with a main surface 2s of the main body portion 2 of the lead frame member 1A. The lead frame member 1A is not limited to the above, and may be, for example, a metal plate before punching.

Next, as illustrated in (2) of FIG. 7, ultrasonic vibration is applied in the direction vertical to the main surface 2s (arrow direction in the drawing) by the ultrasonic device 90. As a result, a temporary groove portion is formed that includes surfaces corresponding to the inner side surface 51, the outer side surface 52, and the bottom surface 53. Here, the inner side surface 51 and the outer side surface 52 are orthogonal to the main surface 2s. The outer side surface 52 faces the inner side surface 51. The bottom surface 53 includes the partial surface 53a intersecting the inner side surface 51 at an acute angle and includes the partial surface 53b intersecting the outer side surface 52 at an acute angle.

Next, as illustrated in (3) of FIG. 7, ultrasonic vibration is applied in a direction parallel to the main surface 2s (horizontal direction, that is, arrow direction in the drawing) by the ultrasonic device 90. As a result, the protruding portions (protrusion) 6 and 6A are formed. More specifically, ultrasonic vibration is applied in the horizontal direction with respect to the blade 10 such that the side surface 11 of the blade 10 is in contact with the inner side surface 51 of the temporary groove portion and the side surface 12 of the blade 10 is in contact with the outer side surface 52 of the temporary groove portion. Thus, the protruding portion 6 is formed along the inner edge of the temporary groove portion, and the protruding portion 6A is formed along the outer edge of the temporary groove portion. As a result, the groove portion 5, the protruding portion 6 protrudingly provided along the inner edge of the groove portion 5, and the protruding portion 6A protrudingly provided along the outer edge of groove portion 5 are formed.

By repeatedly performing the above steps in such a manner that the groove portion 5 and the protruding portions 6 and 6A surround the mounting region 3, the lead frame 1 according to the present embodiment having the groove portion 5, the protruding portion 6, and the protruding portion 6A can be manufactured.

However, a plurality of jigs 100 may be used simultaneously. This can shorten the steps. The same applies to the following embodiments.

Strictly speaking, in the step of (3) of FIG. 7, a gap or the like having a partially horizontal surface is sometimes generated in a portion where the inner side surface 51 and the partial surface 53a intersect or in a portion where the outer side surface 52 and the partial surface 53b intersect. The expression "intersect at an acute angle" used in the present specification includes a case where such a gap or the like is present.

Alternatively, in the step of (3) of FIG. 7, the groove portion 5 in which the protruding portion 6A as illustrated in FIG. 5 is not protrudingly provided may be formed by keeping the side surface 12 of the blade 10 from abutting the outer side surface 52 of the temporary groove portion. For example, in the step of (3) of FIG. 7, by applying force in the lateral direction (leftward direction in the drawing) toward the inner side surface 51 to the blade 10, it is possible to form the groove portion 5 in which the protruding portion 6A is not protrudingly provided.

Figure 8A:
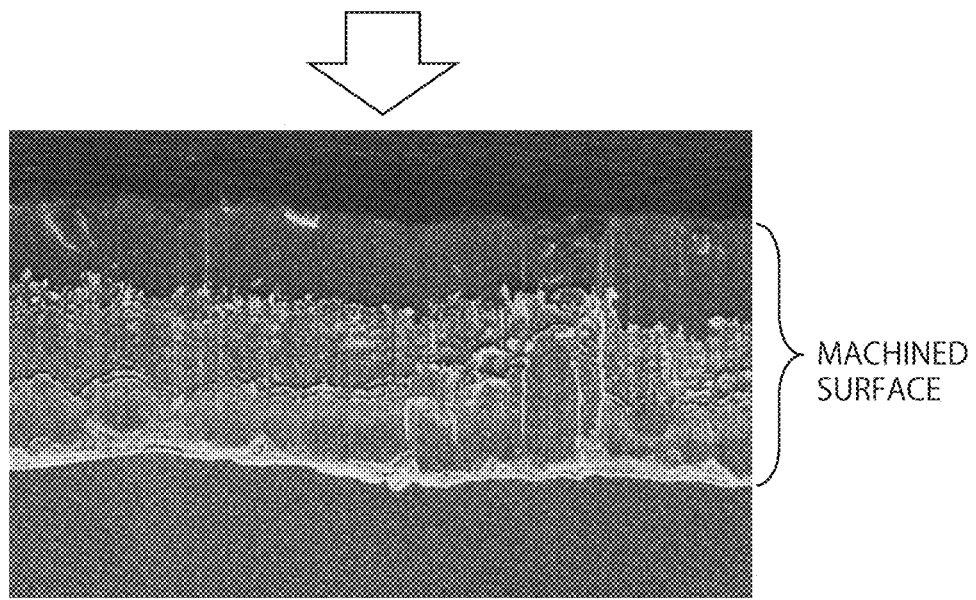
FIG. 8A is an SEM image of a side surface of the groove portion according to the embodiment.
Figure 8B:
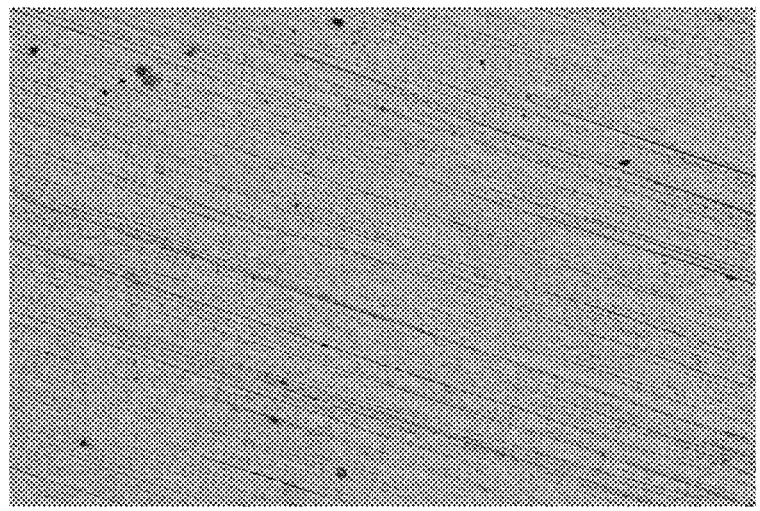
FIG. 8B is an SEM image of a main surface according to the embodiment.

With reference to FIGS. 8A and 8B, a description will be given on surface roughness of the inner side surface 51 and the outer side surface 52 of the groove portion 5 of the lead frame 1 according to the present embodiment. FIG. 8A is a scanning electron microscope image (SEM image) of the inner side surface 51 ("machined surface" in the drawing) according to the present embodiment. This drawing illustrates the surface machined by ultrasonic vibration in the arrow direction from the upper direction in FIG. 8A. FIG. 8B is an SEM image of the main surface 2s according to the present embodiment.

The surface roughness of the inner side surface 51 ("machined surface" in the drawing) of the groove portion 5 according to the present embodiment shown in FIG. 8A is rougher than the surface roughness of the main surface 2s shown in FIG. 8B. Similarly, the surface roughness of the outer side surface 52 of the groove portion 5 is also rougher than the surface roughness of the main surface 2s. This is because the groove portion 5 is formed by ultrasonic vibration. Since the surface roughness of the inner side surface 51 and the outer side surface 52 is rougher than the surface roughness of the main surface 2s, an anchor effect is increased, and peel-off of the sealing portion 70 from the main body portion 2 can be further suppressed. The surface roughness is evaluated using, for example, an arithmetic average roughness Ra, a maximum height Ry, or a ten-point average roughness Rz defined in JIS B 0601 (2013).

As shown in FIG. 8B, in the present embodiment, the surface of the main surface 2s is not subjected to a roughening treatment without being limited thereto, and the surface of the main surface 2s may be subjected to a roughening treatment.

As described above, according to the method of manufacturing the lead frame 1 according to the present embodiment, it is possible to manufacture the lead frame 1 having the groove portion 5, the protruding portion 6, and the protruding portion 6A that have the above-described shapes.

In addition, according to the method of manufacturing the lead frame 1 according to the present embodiment, since the surface roughness of the inner side surface 51 and the outer side surface 52 of the groove portion 5 is rougher than the surface roughness of the main surface 2s, it is possible to provide the semiconductor device 40 capable of further suppressing peel-off of the sealing portion 70 from the main body portion 2.

Further, according to the method of manufacturing the lead frame 1 according to the present embodiment, the shape and location of the groove portion 5 can be easily changed as compared with the case where the groove portion 5 is formed by press working using a mold. For example, the groove portions 5 having various shapes can be easily formed by changing the setting of the ultrasonic device 90 and thereby changing the position, angle, number of times, and the like of touching of the blade 10.

Second Embodiment

Figure 9A:
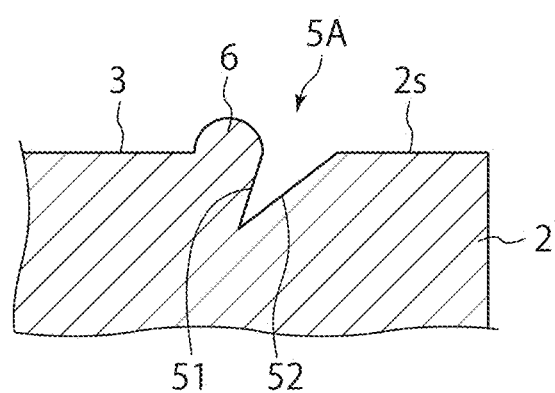
FIG. 9A is a longitudinal sectional view of a groove portion of a lead frame according to a second embodiment.
Figure 9B:
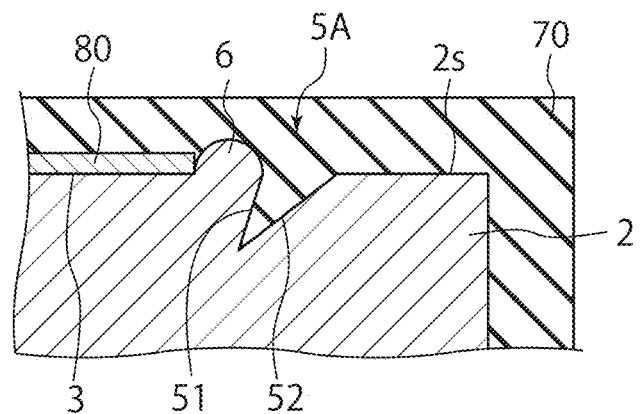
FIG. 9B is a longitudinal sectional view of a groove portion of a semiconductor device according to the second embodiment.

With reference to FIGS. 9A and 9B, a lead frame and a semiconductor device according to a second embodiment will be described. FIG. 9A is a longitudinal sectional view of a groove portion 5A of the lead frame according to the present embodiment. FIG. 9B is a longitudinal sectional view of the groove portion 5A of the semiconductor device according to the present embodiment. The difference between the present embodiment and the first embodiment is the shape of the groove portion. In the following description, a description will be given mainly on the difference from the first embodiment, and descriptions of similar parts will be omitted.

As illustrated in FIGS. 9A and 9B, the groove portion 5A according to the present embodiment has an inner side surface 51 and an outer side surface 52. The inner side surface 51 becomes closer to a mounting region 3 with depth. In addition, the outer side surface 52 becomes closer to the mounting region 3 with depth, and intersects the inner side surface 51 at an acute angle. That is, in the cross-section shown in FIGS. 9A and 9B, the vertical sectional shape of the groove portion 5A is formed in a V-shape by the inner side surface 51 and the outer side surface 52. A bottom portion of the groove portion 5A (the portion where the inner side surface 51 and the outer side surface 52 intersect) is closer to the mounting region 3 than the opening of the groove portion 5A.

In the present embodiment, as illustrated in FIGS. 9A and 9B, a protruding portion 6 is protrudingly provided along the inner edge of the groove portion 5A. On the other hand, the protruding portion 6A is not protrudingly provided along the outer edge of the groove portion 5A.

As shown in FIG. 9B, in the semiconductor device according to the present embodiment, the groove portion 5A is filled with a sealing portion 70. The sealing portion 70 has a shape complementary to the groove portion 5A.

As described above, according to the lead frame and the semiconductor device according to the second embodiment, the protruding portion 6 is protrudingly provided so as to surround the mounting region 3. As a result, it is possible to suppress the mount material 80 from flowing out of the mounting region 3 of the main body portion 2 when the semiconductor chip 60 is mounted on the main body portion 2 of the lead frame. In addition, a junction area between the main body portion 2 and the sealing portion 70 is increased, and it is therefore possible to further suppress peel-off of the sealing portion 70 from the main body portion 2.

According to the lead frame and the semiconductor device according to the present embodiment, as described above, the groove portion 5A has such a shape that the inner side surface 51 becomes closer to the mounting region 3 with depth and that the outer side surface 52 intersects the inner side surface 51 at an acute angle. As a result, an anchor effect of the sealing portion 70 filling the groove portion 5 is increased, and peel-off of the sealing portion 70 from the main body portion 2 can be further suppressed.

Further, the sealing portion 70 has a combination of surfaces intersecting at an acute angle in the part of the sealing portion 70 that fills the groove portion 5. Accordingly, it is possible to further suppress peel-of the sealing portion 70 from the main body portion 2.

(Method of Manufacturing Lead Frame According to Second Embodiment)

Figure 10:
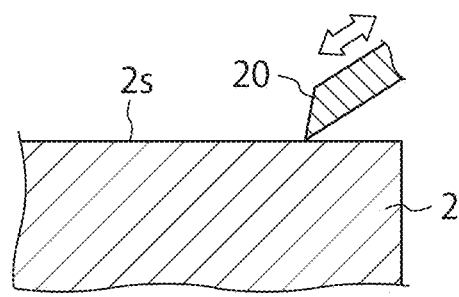
FIG. 10 is a diagram for describing steps of forming the groove portion according to the second embodiment.

Next, with reference to FIG. 10, an example of a method of manufacturing the lead frame according to the second embodiment will be described. FIG. 10 is a view for describing steps of forming the groove portion 5A according to the second embodiment; In the following description, a description will be given mainly on the difference from the lead frame manufacturing method according to the first embodiment, and descriptions of similar parts will be omitted.

First, as illustrated in FIG. 10, a jig for forming the groove portion 5A is prepared. The jig includes a blade 20 and an ultrasonic device (not shown) connected to the blade 20. The material of the blade 20 is arbitrary as long as the material has hardness necessary to form the groove portion 5A, and is, for example, cemented carbide. As the ultrasonic device, the same ultrasonic device as the ultrasonic device 90 described in the first embodiment can be applied.

Next, as shown in FIG. 10, a lead frame member is prepared. Then, the blade 20 is brought into contact with the main surface 2s of the main body portion 2 of the lead frame member in an oblique direction. Thereafter, ultrasonic vibration is applied in a direction oblique to the main surface 2s (arrow direction in the drawing) by the ultrasonic device. As a result, the groove portion 5A and the protruding portion 6 illustrated in FIG. 9A are formed.

By repeatedly performing the above steps in such a manner that the groove portion 5A and the protruding portion 6 surround the mounting region 3, the lead frame according to the present embodiment having the groove portion 5A, the protruding portion 6 illustrated in FIG. 9A can be manufactured.

In the present embodiment, the groove portion 5A and the protruding portion 6 can be manufactured by ultrasonic vibration in a single direction (oblique direction). Therefore, the steps can be simplified as compared with the method of manufacturing the lead frame according to the first embodiment.

Third Embodiment

Figure 11A:
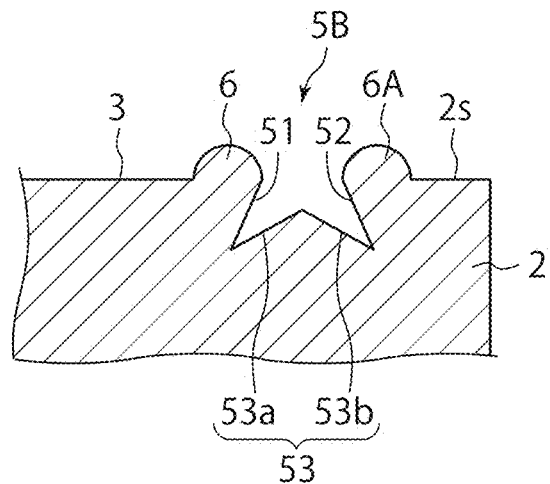
FIG. 11A is a longitudinal sectional view of a groove portion of a lead frame according to a third embodiment.
Figure 11B:
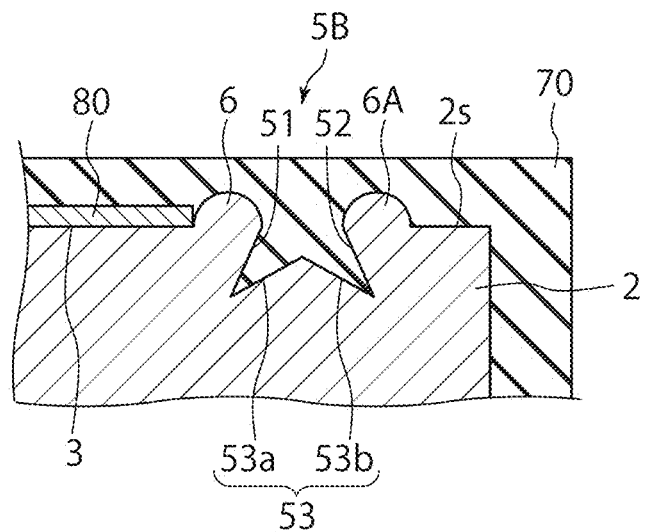
FIG. 11B is a longitudinal sectional view of a groove portion of a semiconductor device according to the third embodiment.

With reference to FIGS. 11A and 11B, a lead frame and a semiconductor device according to a third embodiment will be described. FIG. 11A is a longitudinal sectional view of a groove portion 5B of the lead frame according to the present embodiment. FIG. 11B is a longitudinal sectional view of the groove portion 5B of the semiconductor device according to the present embodiment. The difference between the present embodiment and the first and second embodiments is the shape of the groove portion. In the following description, a description will be given mainly on the difference from the first and second embodiments, and descriptions of similar parts will be omitted.

As illustrated in FIGS. 11A and 11B, the groove portion 5B of the lead frame according to the present embodiment has an inner side surface 51, an outer side surface 52, and a bottom surface 53. The groove portion 5B has a substantially dovetail groove shape. That is, the inner side surface 51 is provided to become closer to the mounting region 3 with depth, and the outer side surface 52 is provided to be farther from the mounting region 3 with depth. The bottom surface 53 is provided so as to connect the inner side surface 51 and the outer side surface 52. As illustrated in FIGS. 11A and 11B, the bottom surface 53 has an inverted V-shape in which a central part is high. More specifically, the bottom surface 53 includes a partial surface 53a and a partial surface 53b. Here, the partial surface 53a is connected to the inner side surface 51 and intersects the inner side surface 51 at an acute angle. The partial surface 53b is connected to the outer side surface 52 and intersects the outer side surface 52 at an acute angle.

In the present embodiment, as illustrated in FIGS. 11A and 11B, a protruding portion 6 is protrudingly provided along the inner edge of the groove portion 5B. In addition, a protruding portion 6A is protrudingly provided along the outer edge of the groove portion 5B.

As shown in FIG. 11B, the groove portion 5B of the semiconductor device according to the present embodiment is filled with a sealing portion 70. The part of the sealing portion 70 that fills the groove portion 5B has a shape complementary to the groove portion 5B.

As described above, according to the lead frame and the semiconductor device according to the third embodiment, the protruding portion 6 is protrudingly provided so as to surround the mounting region 3. As a result, it is possible to suppress the mount material 80 from flowing out of the mounting region 3 of the main body portion 2 when the semiconductor chip 60 is mounted on the main body portion 2 of the lead frame. In addition, a junction area between the main body portion 2 and the sealing portion 70 is increased, and it is therefore possible to further suppress peel-off of the sealing portion 70 from the main body portion 2.

Further, according to the lead frame and the semiconductor device according to the present embodiment, as described above, the groove portion 5B has a shape such that the inner side surface 51 becomes closer to the mounting region 3 with depth, the outer side surface 52 becomes farther from the mounting region 3 with depth, the bottom surface 53 connects the inner side surface 51 and the outer side surface 52 and includes the partial surface 53a and the partial surface 53b intersecting the partial surface 53a, the partial surface 53a intersects the inner side surface 51 at an acute angle, and the partial surface 53b intersects the outer side surface 52 at an acute angle. That is, the groove portion 58 has a plurality of combinations of surfaces intersecting at an acute angle. In the semiconductor device according to the present embodiment, the sealing portion 70 having a shape complementary to the groove portion 58 has, in the part of the sealing portion 70 that fills the groove portion 5B, a plurality of combinations of surfaces intersecting at an acute angle. Accordingly, it is possible to further suppress peel-of the sealing portion 70 from the main body portion 2. In addition, as compared with the second embodiment, an anchoring effect of the sealing portion 70 filling the groove portion 58 is further increased, and peel-off of the sealing portion 70 from the main body portion 2 can be further suppressed.

According to the lead frame and the semiconductor device according to the present embodiment, the protruding portion 6A is protrudingly provided along the outer edge of the groove portion 58. As a result, a junction area between the main body portion 2 and the sealing portion 70 is increased, and it is possible to further suppress peel-off of the sealing portion 70 from the main body portion 2.
(Method of Manufacturing Lead Frame According to Third Embodiment)

Figure 12:
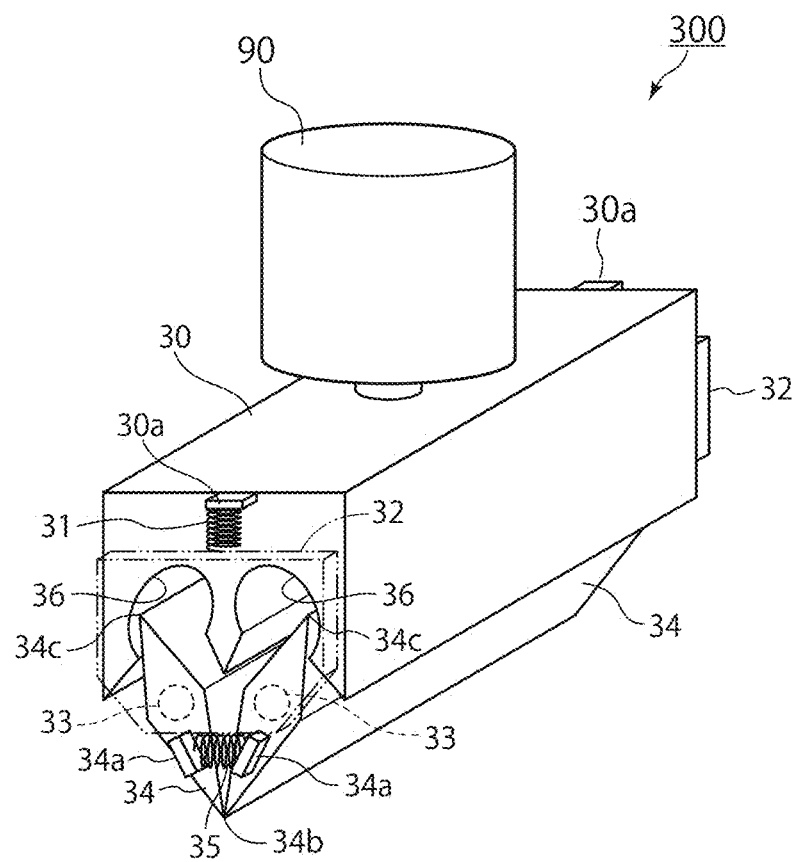
FIG. 12 is a partially transparent perspective view of a jig forming the groove portion according to the third embodiment.
Figure 13:
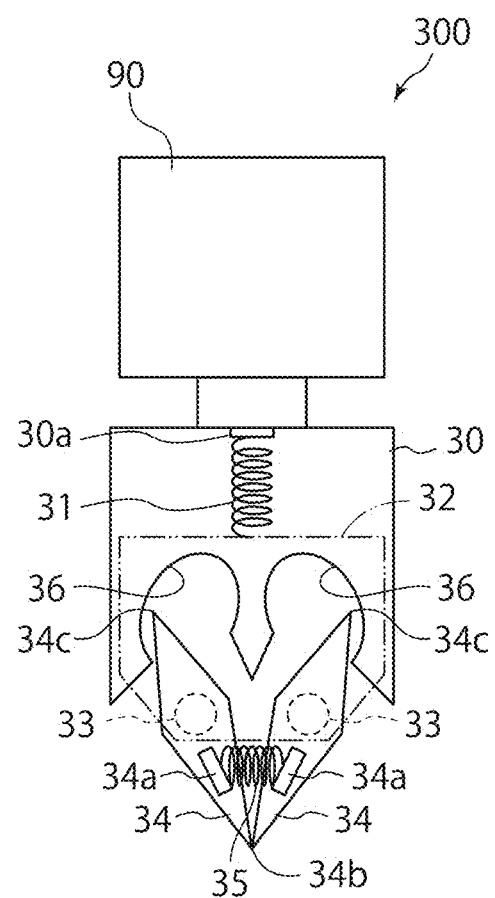
FIG. 13 is a partially transparent front view of the jig for forming the groove portion according to the third embodiment.
Figure 14:
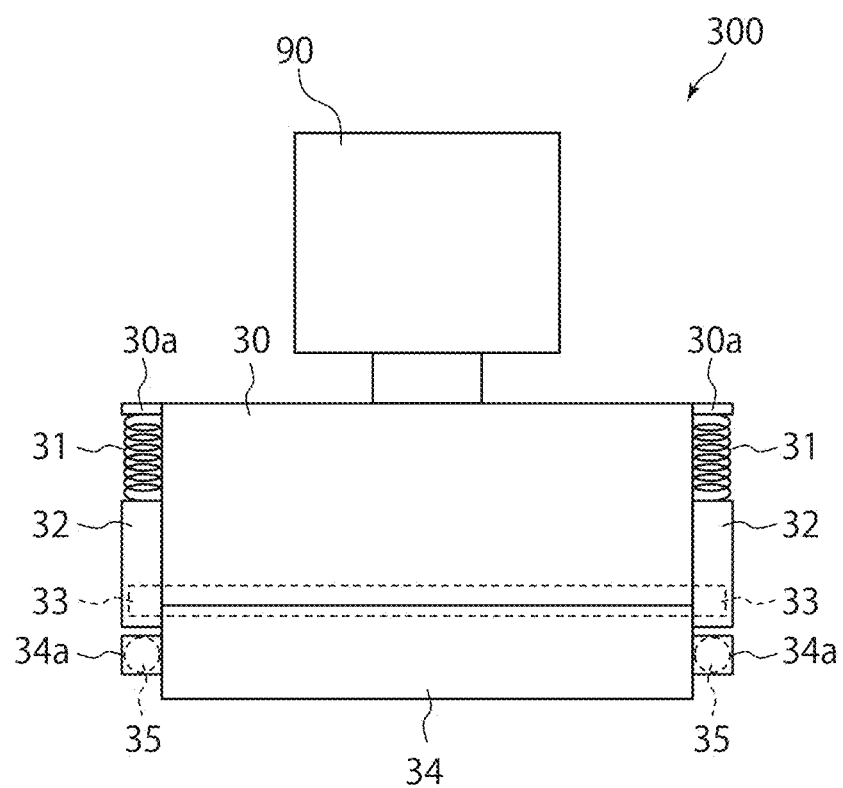
FIG. 14 is a side view of the jig for forming the groove portion according to the third embodiment.
Figure 15:
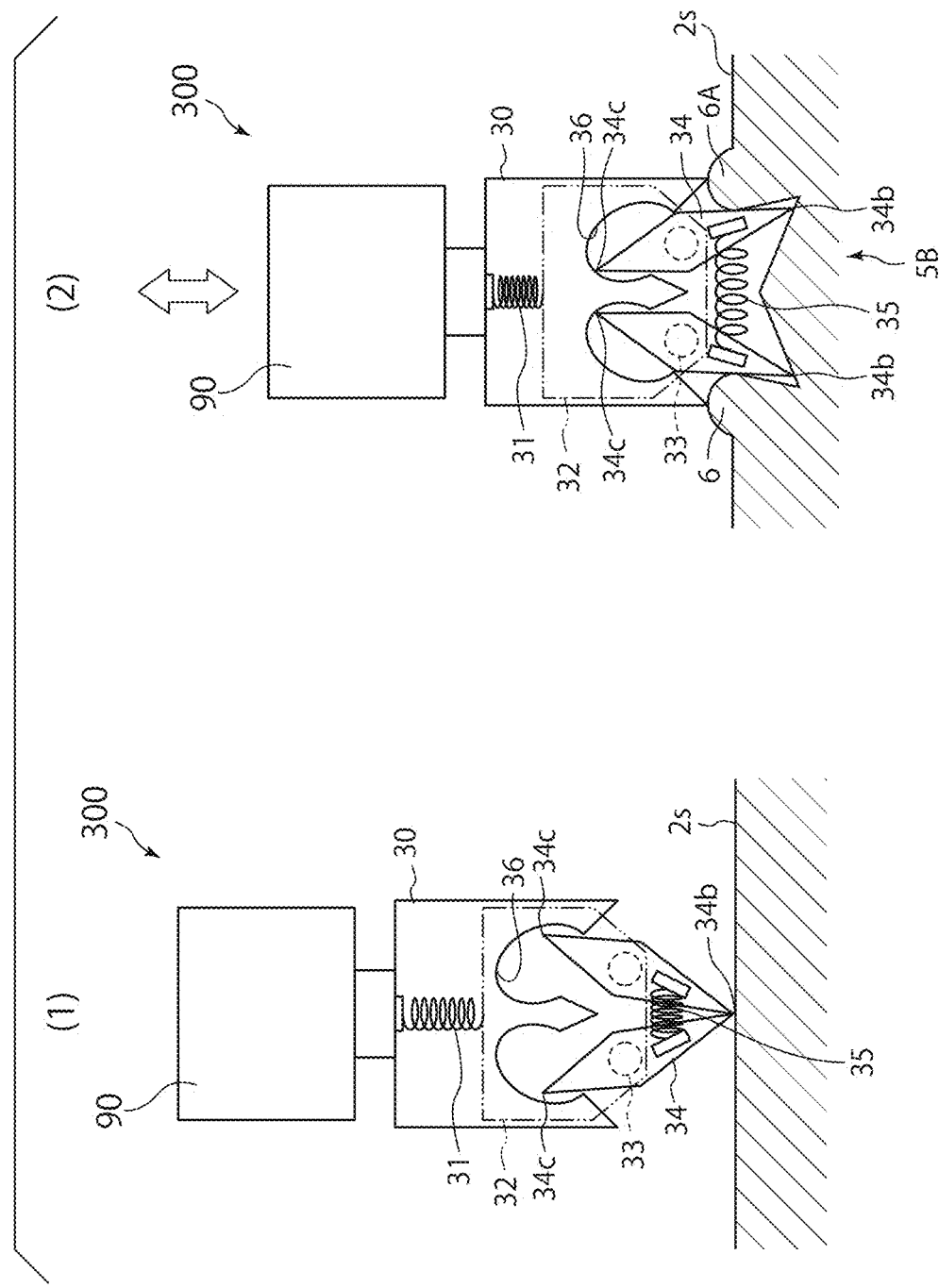
FIG. 15 is a view for describing steps of forming the groove portion according to the third embodiment.

With reference to FIGS. 12 to 15, an example of a method of manufacturing the lead frame according to the third embodiment will be described. FIG. 12 is a partially transparent perspective view of a jig 300 for forming the groove portion 5B according to the present embodiment. FIG. 13 is a partially transparent front view of the jig 300, and FIG. 14 is a side view of the jig 300. FIG. 15 is a diagram for describing steps of forming the groove portion 5B according to the present embodiment. Note that, in FIGS. 12, 13, and 15, a fixing plate 32 on the near side (front side) is shown in a transparent manner for easy understanding of the structure of the jig 300. In the following description, a description will be given mainly on the difference from the methods of manufacturing the lead frames according to the first and second embodiments, and descriptions of similar parts will be omitted.

First, the jig 300 for forming the groove portion 5B according to the present embodiment is prepared. As illustrated in FIGS. 12 to 14, the jig 300 includes an ultrasonic device 90, a jig main body 30, a plurality of spring fixing portions 30a protrudingly provided from a front surface and a back surface of the jig main body 30, a plurality of springs 31 one ends of which are connected to respective ones of the spring fixing portions 30a, two fixing plates 32 connected to the other ends of respective ones of the springs 31, two fixing pins 33 connecting the two fixing plates 32 to each other, two cutter blades 34 in the central parts of which respective ones of the fixing pins 33 are inserted and which are rotatably supported by the respective ones of the fixing pins 33, spring fixing portions 34a provided on respective ones of the front surface and the back surface of each cutter blade 34, and a plurality of springs 35 both ends of which are connected to the plurality of spring fixing portions 34a and which connect the two cutter blades 34 to each other via the spring fixing portions 34a. The two cutter blades 34 are closed by restoring forces of the springs 35 such that tips 34b are brought into contact with each other. The material of the two cutter blades 34 is arbitrary as long as the material has hardness necessary to form the groove portion 5B, and is, for example, cemented carbide.

The jig main body 30 includes recesses 36 in which parts of the cutter blades 34 are accommodated. The shape of the recesses 36 is formed so that the width between the tips of the two cutter blades 34 is increased when the cutter blades 34 rotate around the fixing pins 33.

After the jig 300 is prepared, as shown in (1) of FIG. 15, the jig 300 is brought into vertical contact with the main surface 2s of the main body portion of the lead frame member. That is, the tips 34b of the cutter blades 34 of the jig 300 are brought into contact with the main surface 2s as illustrated in (1) of FIG. 15.

Next, as illustrated in (2) of FIG. 15, the ultrasonic device 90 is caused to operate to apply ultrasonic vibration in the direction vertical to the main surface 2s (arrow direction in the drawing). As excavation of the groove portion progresses, the tips 34b of the cutter blades 34 receives an upward force from the main surface 2s as a reaction, and the fixing plate 32 are lifted upward with respect to the jig main body 30 against restoring forces of the springs 31. As a result, base ends 34c of the cutter blades 34 move along the surfaces of the recesses 36 of the jig main body 30, so that the tip 34b of each cutter blade moves outward against a restoring force of the spring 35, and the width between the tips 34b is increased. As a result, the groove portion 5B and the protruding portions 6 and 6A having the shape illustrated in (2) of FIG. 15 are formed.

By repeatedly performing the above steps in such a manner that the groove portion 5B and the protruding portions 6 and 6A surround the mounting region 3, the lead frame according to the present embodiment having the groove portion 5B, the protruding portions 6 and 6A can be manufactured.

The groove portion 5B may be formed by performing ultrasonic machining from two oblique directions by using the jig of the second embodiment. The jig 300 of the present embodiment is preferably used. As a result, it is possible to manufacture by ultrasonic vibration in a single direction (longitudinal direction), so that the steps can be shortened. In addition, the shape of the groove portion 5B can be formed more stably.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A lead frame comprising:
   a main body portion having a main surface including a mounting region on which a semiconductor chip is to be mounted;
   a lead portion connected to the main body portion;
   a groove portion provided in the main surface of the main body portion so as to surround the mounting region, the groove portion having an inner side surface and an outer side surface;
   a first protruding portion protrudingly provided along an inner edge of the groove portion; and
   a second protruding portion that is provided along an outer edge of the groove portion and is different from the first protruding portion.

2. The lead frame according to claim 1, wherein the inner side surface of the groove portion is orthogonal to the main surface,
   the outer side surface of the groove portion is orthogonal to the main surface and faces the inner side surface, and
   the groove portion further includes a bottom surface that connects the inner side surface and the outer side surface, the bottom surface including:
   a partial surface intersecting the inner side surface at an acute angle; and
   a partial surface intersecting the outer side surface at an acute angle.

3. The lead frame according to claim 2, wherein surface roughness of the inner side surface of the groove portion is rougher than surface roughness of the main surface.

4. The lead frame according to claim 1, wherein the inner side surface of the groove portion becomes closer to the mounting region with depth, and the outer side surface of the groove portion intersects the inner side surface at an acute angle.

5. The lead frame according to claim 4, wherein surface roughness of the inner side surface of the groove portion is rougher than surface roughness of the main surface.

6. The lead frame according to claim 1, wherein the inner side surface of the groove portion becomes closer to the mounting region with depth,
the outer side surface of the groove portion becomes farther from the mounting region with depth,
the groove portion further includes a bottom surface that connects the inner side surface and the outer side surface, the bottom surface including:
a first partial surface; and
a second partial surface intersecting the first partial surface,
wherein the first partial surface intersects the inner side surface at an acute angle, and
the second partial surface intersects the outer side surface at an acute angle.

7. The lead frame according to claim 6, wherein surface roughness of the inner side surface of the groove portion is rougher than surface roughness of the main surface.

8. The lead frame according to claim 1, wherein surface roughness of the inner side surface of the groove portion is rougher than surface roughness of the main surface.

9. A semiconductor device comprising:
the lead frame according to claim 1;
a semiconductor chip mounted on the mounting region of the lead frame via a mount material; and
a sealing portion that is provided so as to embed the semiconductor chip in the sealing portion and fills the groove portion.

10. The semiconductor device according to claim 9, wherein a height of the first protruding portion is higher than a height of an upper surface of the mount material.

11. The semiconductor device according to claim 9, wherein the inner side surface of the groove portion is orthogonal to the main surface,
the outer side surface of the groove portion is orthogonal to the main surface and faces the inner side surface, and
the groove portion further includes a bottom surface that connects the inner side surface and the outer side surface, the bottom surface including:
a partial surface intersecting the inner side surface at an acute angle; and
a partial surface intersecting the outer side surface at an acute angle.

12. The semiconductor device according to claim 11, wherein a height of the first protruding portion is higher than a height of an upper surface of the mount material.

13. A lead frame comprising:
a main body portion having a main surface including a mounting region on which a semiconductor chip is to be mounted;
a lead portion connected to the main body portion;
a groove portion provided in the main surface of the main body portion so as to surround the mounting region, the groove portion having an inner side surface and an outer side surface; and
a protruding portion protrudingly provided along an inner edge of the groove portion; wherein
the inner side surface of the groove portion becomes closer to the mounting region with depth, and the outer side surface of the groove portion intersects the inner side surface at an acute angle.

14. A lead frame comprising:
a main body portion having a main surface including a mounting region on which a semiconductor chip is to be mounted;
a lead portion connected to the main body portion;
a groove portion provided in the main surface of the main body portion so as to surround the mounting region, the groove portion having an inner side surface and an outer side surface; and
a protruding portion protrudingly provided along an inner edge of the groove portion; wherein
the inner side surface of the groove portion is orthogonal to the main surface,
the outer side surface of the groove portion is orthogonal to the main surface and faces the inner side surface, and
the groove portion further includes a bottom surface that connects the inner side surface and the outer side surface, the bottom surface including:
a partial surface intersecting the inner side surface at an acute angle; and
a partial surface intersecting the outer side surface at an acute angle.

* * * * *